United States Patent [19]
Devoe et al.

[11] Patent Number: 5,625,528
[45] Date of Patent: Apr. 29, 1997

[54] MONOLITHIC, BURIED-SUBSTRATE, CERAMIC MULTIPLE CAPACITORS ISOLATED, ONE TO THE NEXT, BY DUAL-DIELECTRIC-CONSTANT, THREE-LAYER-LAMINATE ISOLATION LAYERS

[76] Inventors: Daniel F. Devoe, 610 First St., Coronado, Calif. 92118; Alan D. Devoe, 5715 Waverly Ave., La Jolla, Calif. 92037

[21] Appl. No.: 528,855

[22] Filed: Sep. 15, 1995

Related U.S. Application Data

[63] Continuation-in-part of Ser. No. 342,595, Nov. 21, 1994, abandoned, Division of Ser. No. 964,150, Oct. 21, 1992, Pat. No. 5,367,430.

[51] Int. Cl.$^6$ .................. H01G 4/00; H01G 4/06; H01G 4/12
[52] U.S. Cl. .................. 361/321.1; 361/321.2; 361/312; 361/328; 361/301.1
[58] Field of Search .................. 361/272, 275.1, 361/301.4, 303, 304, 306.1, 306.2, 306.3, 308.1, 309, 312, 313, 320, 321.1, 321.2, 321.3, 321.4, 321.5, 328, 329, 330, 301.1; 29/25.42

[56] References Cited

U.S. PATENT DOCUMENTS 4,882,650  11/1989  Maher et al. .................. 361/321

Primary Examiner—Leo P. Picard
Assistant Examiner—Anthony Dinkins
Attorney, Agent, or Firm—Fuess & Davidenas

[57] ABSTRACT

A monolithic, buried-substrate, ceramic multiple capacitor is laid up as multiple capacitors that are isolated, one to the next, by a dual-dielectric-constant, three-layer-laminate, isolation layer. Each isolation layer has and presents (i) an innermost layer of a low dielectric constant (low K) material, located between (ii) outer laminate layers of a high dielectric constant (high K) material. By such construction negative effects of the physio-chemical reaction (i) occurring at the boundary between the high-K and low-K layers, (ii) contaminating the high-K dielectric and lowering its K, and (iii) undesirably serving both to lower the capacitance of any (buried substrate) capacitor that makes use of the ("contaminated") high-K dielectric while increasing capacitor leakage current, are mitigated or avoided. This occurs because the physio-chemical reaction zone, or band, located between the high-K dielectric layers (from which each buried-substrate capacitor is formed) and the low-K dielectric isolation layer (between successive capacitors) is moved slightly away from the region of the capacitor itself. Moreover, the ceramic multiple capacitor is strongly and stably fused together in its several layers, which different layers of different dielectric constant have different thermal coefficients of expansion, because the outer (high-K) laminate layers of the isolation layer are preferably of intermediary thickness between the innermost (low-K) layer and the (high-K) dielectric layers of the bordering buried-substrate capacitors.

8 Claims, 10 Drawing Sheets

MONOLITHIC, BURIED-SUBSTRATE, CERAMIC MULTIPLE CAPACITORS ISOLATED, ONE TO THE NEXT, BY DUAL-DIELECTRIC-CONSTANT, THREE-LAYER-LAMINATE ISOLATION LAYERS

RELATION TO THE RELATED PATENT APPLICATIONS

The present patent application is a continuation-in-part of U.S. patent application Ser. No. 08/342,595 filed on Nov. 21, 1994, now abandoned which application is a divisional of U.S. patent application Ser. No. 07/964,150 filed on Oct. 21, 1992 for a MONOLITHIC MULTIPLE CAPACITOR to inventors Alan D. Devoe and Daniel F. Devoe, a patent on which application issued on Nov. 24, 1994, as U.S. Pat. No. 5,367,430.

The present application is also related to U.S. patent application Ser. No. 08/528,856 filed on an even date herewith for CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS, and also to U.S. patent application Ser. No. 08/528,885 filed on an even date herewith for PRINTING AND ADHERING PATTERNED METAL ON A LAID-UP MULTI-LAYER GREEN WAFER BEFORE FIRING SO AS TO LATER FORM PRECISE INTEGRAL CO-FIRED CONDUCTIVE TRACES AND PADS ON SELECTED TOP AND BOTTOM SURFACES OF MONOLITHIC, BURIED-SUBSTRATE, CERAMIC MULTIPLE CAPACITORS DICED FROM THE WAFER, INCLUDING PADS SUPPORTING SURFACE MOUNTING AND/OR MOUNTING IN TIERS, both of which related applications are to the same two inventors as is the present application.

The contents of the predecessor and two related patent applications are incorporated herein by reference.

BACKGROUND OF THE INVENTION

1. Field of the Invention

The present invention generally concerns the dielectric composition of the several capacitors that are within a monolithic, buried-substrate, multiple capacitor, and particularly concerns the composition of the dielectric material of the monolithic multiple capacitor in its regions between its several buried capacitors.

The present invention still more particularly concerns the several buried capacitors of a buried-substrate, ceramic multiple capacitor which buried capacitors are isolated, one to the next, by a dual-dielectric-constant, three-layer-laminate, isolation layer that has and presents (i) a high dielectric constant (high K) at each of the two outer layers of the laminate, on either side of a low dielectric constant (low K) inner layer.

2. Description of the Prior Art

2.1 The Structure of Monolithic Multiple Buried-Substrate Capacitors

A monolithic buried-substrate, or multiple buried-substrate, multiple capacitor is sometimes identified with the two words "substrate" and "capacitor" reversed, and is sometimes called a Buried Capacitor Substrate, or BCS. Howsoever called, BCSs accord significant size reduction to microelectronic applications. A BCS integrates capacitors, resistors and traces together into a thin, multilayer, monolith which can be joined with integrated circuit ("IC") devices. Volumetric reductions over individual "chip" capacitor and/or resistor components of 50% to 75% are possible because the BCS both eliminates the air gaps between passive components and replaces the alumina substrate of traditional hybrids.

A BCS accords the freedom to mount one or more ICs directly onto itself (or perhaps even one on each side). The composite device so formed can then be attached to a ribbon lead, a larger hybrid, or a Multi Chip Module. The BCS is also compatible with flip chip IC designs, giving the most dense hybrids presently possible, circa 1995.

Substrate density and management of parasitic capacitances are the technological keys to BCS miniaturization. A BCS desirably uses the finest possible spacing for electrical connections around its edges (typically 0.020"), thus offering the greatest number of connections between an IC and the multiple capacitors that are buried within the BCS. Stray capacitance between these connections is preferably controlled by the unique castellation forming technique taught in the related U.S. Pat. No. 5,367,430 for a MONOLITHIC MULTIPLE CAPACITOR. Inside the BCS, multilayer technologies are used. Stray capacitance between these layers is preferably controlled by the use of high and low K dielectrics in combination, as is taught in U.S. Pat. No. 4,419,714 to Locke. These techniques combine to maintain parasitic capacitance at low levels, and to give low coupled noise, between internal capacitors.

Conductive traces and/or pads are typically placed only upon a "top", and sometimes also a "bottom", surface of the BCS. These conductive traces and/or pads are the basis by which electrical connections to the BCS are made. They have previously been formed by printing, particularly by screen printing and more particularly by silk screening.

Electrical connection to these various top and/or bottom surface printed conductive traces and pads can be made by soldering, various types of wire bonding, and/or flip-chip die attach. The BCS itself can be attached by soldering to either a larger hybrid, a Multi Chip Module, or a flexible ribbon cable. IC's and discrete components can be attached at one or another surfaces of the BCS. The conductive surface traces and pads are typically printed as 5 mil lines with 5 mil spacing, and in any pattern required to fit the application.

Electrical connection between the capacitors buried within the BCS and the printed circuit traces and pads upon its top and/or bottom surfaces are preferably made as a series of castellations along one or more sides of the BCS. The series of castellations provide selective electrical connection from the plates of capacitors within the body of the BCS to particular conductive traces and pads the top and/or bottom surfaces of the BCS. The castellations consist of metallized pads separated by 6 to 12 mil deep air gaps. A pitch 0.020 inches between castellations is possible while still retaining excellent solder reflow characteristics. These castellations are, again, the subject of related U.S. Pat. No. 5,367,430 for a MONOLITHIC MULTIPLE CAPACITOR.

A soldered connection to a castellation can provide a variety of electrical connections: 1) directly to the IC; 2) through a passive component and then to the IC; or 3) to the IC with a capacitor shunt to ground. In cases where an IC on each side of the BCS requires many I/O connections, a series of castellations can be made with 5 mil pads and 5 mil spaces.

BCS can be produced in a variety of sizes. A typical minimum size is 0.070 by 0.070 inches. The size of a BCS will usually be chosen based on capacitance values desired, the voltage rating, and internal space needed to control stray capacitance. Any sizes up to 1" by 1" and larger are possible, with maximum capacitance values near 10 uF. Again, the actual capacitance value achieved depends on the voltage rating required.

Because a BCS contain non-symmetric buried plates, variation in surface flatness can be expected. Production techniques allow three controls of this irregularity. A BCS can be made so that the top surface is flat and the bottom surface contains all the irregularity. A BCS can be made so that the bottom surface is flat and the top surface contains all the irregularity. Finally, a BCS can be made so that the irregularity is averaged on both sides, so that it is equally absorbed by the top and bottom surfaces.

Internal conductor traces can be used to connect castellations on side surface of the BCS to castellations upon another side surface of the BCS. Usually this is needed when internal capacitor arrangements make conventional layouts impossible, or to accommodate existing IC pad locations. The layer of connective traces can be put in at any level within the BCS, depending on what is optimal for reducing stray capacitance.

Various designs of the internal plates of each buried capacitor within a BCS are possible. Capacitance value depends on the active area of each capacitor and the number of layers used.

It is possible to design one or more capacitors adjacent to an internal ground plane. By changing the position of connecting tabs, almost any connection configuration can be achieved.

Shielded capacitors are created by having a series of capacitor plates which are surrounded by two ground planes. This shielding can occur above and below the capacitor or along the edge of the BCS.

Coupling capacitors can be designed using a stack of individual opposing plates. Again, capacitance value depends on the number of layers and the active area of each chip.

In a typical BCS, capacitors are stacked in different levels within the BCS; one or more capacitors are built on each level, and each capacitor tabs out to a different castellation. Typically one castellation will connect to all internal ground planes.

Stray capacitance between different internal capacitors within the BCS is controlled by varying the distance between the capacitors on the same level or by varying the layer thickness between levels.

BCS are commonly made from any of NPO, X7R, and Z5U dielectrics. For ease of designing a substrate, the dielectrics can be thought of as capacitance achieved per unit area, given a normalized dielectric thickness.

For an area 0.1 inches on a side, at a dielectric thickness of 0.001 inches, typical BCS capacitance values are as follows:

| Dielectric | Capacitance per .01 inch square @ 1.0 mil thick |
|---|---|
| NPO | 312.7 pF |
| X7R | 7417 Pf |
| ZSU | 6,477 Pf |

2.2 Previous Use of Multiple Dielectrics in Monolithic Buried-Substrate Ceramic Multiple Capacitors It is previously know to make a monolithic buried-substrate ceramic multiple capacitor with, and from, multiple dielectrics that vary in dielectric constant (K). U.S. Pat. No. 4,882,650 to Maher, et al. for a MAGNESIUM TITANTATE CERAMIC AND DUAL DIELECTRIC SUBSTRATE USING SAME describes such a capacitor where each of multiple buried-substrate capacitors—formed from relatively thin alternating layers of a high dielectric constant (high-K) dielectric material and metallization—are separated, one capacitor to the next, by a relatively thick layer of a low dielectric constant (low-K) dielectric material. The purpose of the isolation layer of a material that, with its low dielectric constant (low-K), is different from the high dielectric constant (higher-K) material of the capacitors themselves, is to better reduce parasitic coupled capacitance, and thus any electrical cross-talk, between the buried capacitors.

Maher, et al, specifically discuss the interface between the high-K dielectric material of the capacitors and low-K dielectric material of the isolation layer between capacitors. Maher, et al, teach that it the materials on both sides of this interface must be physically and chemically compatible. Maher, et al, recommend barium titanate as the high-K material and magnesium zinc titanate as the low-K material. The average chemical composition of a "reaction band" between these differing layers is found to be $Mg_{0.5}Ba_{0.25}Zn_{0.25}TiO_3$. This reaction band is formed when the two differing layers are co-sintered. The ratio of the dielectric constants of the two material preferably exceeds 100.

Applicants have no quarrel with the general principal of the Maher, et al, invention that large value buried-substrate capacitors made from high-K material should be isolated one to the next by intervening regions of low-K material. However, Maher et al. recognize that a physio-chemical reaction occurs at the boundary of the high-K and low-K layers during sintering. Applicants find this reaction—the "reaction band" of Maher, et al.—to be too close to, and excessively overlapping of, each outer (high-K) dielectric layer of a buried substrate capacitor to which the low-K dielectric, isolation, layer abuts. This is true of the ceramic multiple capacitor of the Maher, et al, design and all others where the outer layer of a buried-substrate capacitor is of a high-K material.

The reaction band "contaminates" the high-K dielectric and lowers its K. This undesirably serves to both (i) lower the capacitance of the (buried substrate) capacitor of which the ("contaminated") high-K dielectric is a layer, and (ii) increase leakage current. It would be desirable if this "contamination" of the buried substrate capacitor could be avoided while still realizing the advantages of an isolation zone, or layer, of low-K material, as is taught by Maher, et al.

Furthermore, it should be understood that a ceramic multiple capacitor is fused together in its several layers by the process of sintering. Whenever the different layers have differing thermal coefficients of expansion, than fracturing between layers is possible both (i) during sintering, and (ii) thereafter as the ceramic multiple capacitor is subjected to temperature changes and/or shock during use (such as in an electrical circuit). The thickness, as well as the thermal coefficient of expansion, of the sintered layers affects their stability. Progressing directly from relatively thin to relatively thick layers of different materials—which layers have different thermal coefficients of expansion as is the case in the Maher, et al. design—aggravates the potential for mechanical fracture induced by thermal stress.

Although thermally induced stress fractures are not a common failure mode in ceramic multiple capacitors— which are very robust and reliable components in the first place—if a ceramic multiple capacitor is rapidly cycled over a very broad temperature range—such as might happen, inter alia, in a spacecraft—and/or strongly shocked, then fracture failures can occur. Such fractures as do occur can generally be related, as would be expected, to the "weakest" boundaries between the many, many layers of the ceramic multiple capacitor. The boundaries occurring between the differing-thickness different-material layers (which are also of different dielectric constants) turn out to some of the weakest, and most failure prone, int eh multiple ceramic capacitor. Accordingly, it would be useful if something could be done at or between the necessarily thin layers of a buried-substrate capacitor and the necessarily thick isolation layer (of low-K dielectric) so as to, among other things, improve the mechanical stability of this region to thermal stress and/or mechanical shock.

The present invention is directed to (i) reducing any negative impact on buried-substrate capacitors (made from layers, including outer layers, of high dielectric constant material) due to adjacent isolation layers of low dielectric constant material. The present invention is further directed to (ii) improving the mechanical stability between regions of high and low dielectric constant material in a ceramic multiple capacitor where multiple buried-substrate capacitors that are built (in part) from high dielectric constant (high-K) material are separated, one to the next, by regions of low dielectric constant (low-K) material.

SUMMARY OF THE INVENTION

The present invention contemplates a monolithic, buried-substrate, ceramic multiple capacitor containing multiple capacitors that are isolated, one to the next, by dual-dielectric-constant, three-layer-laminate, isolation layers. Each isolation layer has and presents (i) an innermost layer of a low dielectric constant (low K) material, between (ii) outer laminate layers each of a high dielectric constant (high K) material.

Capacitors of the present invention that are so electrically isolated one to the next have, by virtue of the low dielectric constant (low-K) material incorporated in the isolation layer, a desirably lower parasitic capacitance, and a desirably lower electrical crosstalk, between the isolated buried-substrate capacitors than would be the case if an isolation layer of equivalent thickness was to be made entirely of the same high-K dielectric material that serves to separate the plates of the buried-substrate capacitors themselves. However, these same capacitors of the present invention that are so electrically isolated one to the next have, might also be expected to have, in accordance with the fact that the 100% entire (three-layer-laminate) isolation layer is not uniformly of low-dielectric constant (low-K) material, a slightly inferior parasitic capacitance, mutatis mutandis, to certain previous multiple-dielectric capacitors that are described by Maher, et al. in U.S. Pat. No. 4,882,650 for a MAGNESIUM TITANTATE CERAMIC AND DUAL DIELECTRIC SUBSTRATE USING SAME. This is in fact the case. (Moreover, the isolation layers in preferred embodiments of ceramic multiple capacitors in accordance with the present invention are typically thinner than are those isolation layers in the previous ceramic multiple capacitors described by Maher, et al—again making that parasitic capacitance between buried-substrate capacitors is not minimized to the fullest extent possible.)

The reasons why the parasitic capacitances between the buried capacitors in and of a ceramic multiple capacitor in accordance with the present invention are improved, while not being so improved absolutely as much as is possible, are threefold.

A first, and most important, reason is so that the negative effects of such an apparently unavoidable physio-chemical reaction as (i) occurs at the boundary between the high-K and low-K layers, (ii) "contaminates" the high-K dielectric and lowers its K, and (iii) undesirably serves both (a) to lower the capacitance of any (buried substrate) capacitor that makes use of the ("contaminated") high-K dielectric, and (b) to increase leakage current, are mitigated. The negative effects are so mitigated because the physio-chemical reaction zone, or band, between the high-K dielectric layers (from which each buried-substrate capacitor if formed) and the low-K dielectric isolation layer (between successive capacitors) is moved slightly from the region of the region of the capacitor itself. So moved in position, this reaction zone no longer appreciably "contaminates" the high-K dielectric material, and no longer lowers its K. The capacitance of the buried-substrate capacitor is no longer undesirably lowered, nor is its leakage current undesirably increased. The reaction zone, or band, is moved into the isolation region between capacitors themselves (where it has no appreciable deleterious effect save that the low-K of this region should slightly be raised).

Another way of describing this "movement" is that the boundary between high-K and low-K material is no longer located directly at each final, edge, (high-K) layer of a buried-substrate capacitor, but is instead spaced from this capacitor layer by yet another layer of high-K material. It is this buffer layer that finally borders on, and reacts with, the isolation zone, or layer, of low-K material.

The boundary layer is moved an "n-tuple" of the normal thickness of a standard, high-K, dielectric layer isolating adjacent plates of those buried-substrate capacitors that are isolated by the three-layer laminate isolation layer. "N" is normally two (2) or greater, making that the boundary zone, or region, is moved at least twice as far into the isolation zone as is the normal spacing between adjacent plates of the buried-substrate capacitors. The thickness of the low-K material forming the middle layer of the three-layer laminate isolation layer is also normally at least two (2) or more, and more typically four (4), times greater that is the normal spacing, or thickness of the (high-K material) dielectric layer, between adjacent plates of buried-substrate capacitors. Accordingly, the entire isolation zone in all its three (3) layers is normally at least six (6), and is more typically eight (8), times as thick as is the normal spacing between adjacent plates of the buried-substrate capacitors.

A second reason for moving the reaction zone, or band, is to produce a ceramic multiple capacitor that is believed to be more strongly and stable fused together in its several layers than is, for example, the previous capacitor of Maher, et al. This belief is based on the fact that different layers of different dielectric constant, and the metallization layers of the buried capacitors, inevitably have slightly different thermal coefficients of expansion. In the previous capacitor of Maher, et al. (i) a final, thin, metallization layer of a buried capacitor was directly bordered by (ii) a final, generally thin, high-K insulating layer which is itself directly bordered by (iii) a generally thick low-K buffer layer isolating the next capacitor (which capacitor is itself similarly bordered by counterpart layers in the reverse order). That is, the insulating layers went from thin to thick aa the same time as the dielectric constant of these layers went from high to low.

Progressing directly from thin to thick layers of different materials, which materials have different thermal coefficients of expansion, aggravates the potential for mechanical fracture induced by thermal stress. It is better to progress in a number or layers of progressively increasing thickness. Although fracture failure modes are not particularly common in a ceramic multiple capacitors, if such a capacitor is rapidly cycled over a very broad temperature range—such as might happen, inter alia, in a spacecraft—and/or if it is strongly shocked, then the resulting fracture failures can be related, as would be expected, to the "weakest" boundaries of the many, many layers within the ceramic multiple capacitor.

The present invention placing an intermediary thickness layer (normally of high-K dielectric material) between a necessarily thin (high-K) outer dielectric layer of a buried-substrate capacitor and a necessarily thick isolation layer (of low-K dielectric). This layer of intermediary thickness serves to, among other things, improve the mechanical stability of this region to thermal stress and/or to mechanical shock. The intermediary thickness layer—when constructed as is preferable from the same high-K dielectric material is the buried-substrate capacitor that it borders—is of course the same layer that serves to move the reaction zone, or band.

As a third and final reason, and recalling that the isolation layer of the present invention might be, and commonly is, slightly less effective electrically in isolating adjacent buried-substrate capacitors than is, for example, the isolation layer Maher, et al, this diminished isolation is not invariably bad. Applicants teach in their related patent application for CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS that only such capacitance as is neither electrically connected nor functionally used is called "parasitic"—a capacitance of a parasitic nature that is both electrically connected and functionally used is, by definition, no longer "parasitic".

Applicants electrically connect to, and functionally use, more of this (heretofore) "parasitic" capacitance present within a ceramic multiple capacitor than was done previously. It therefore not adverse to the present invention that such "parasitic" capacitance as inevitably exists within a ceramic multiple capacitor, and particularly between the buried-substrate capacitors themselves, is not maximally suppressed.

According to all these three reasons, the parasitic capacitances between the buried capacitors in and of a ceramic multiple capacitor in accordance with the present invention are improved, but are not so improved absolutely as much as is possible because to do so causes other problems.

These and other aspects and attributes of the present invention will become increasingly clear upon reference to the following drawings and accompanying specification.

DESCRIPTION OF THE PREFERRED EMBODIMENT

Figure 1:
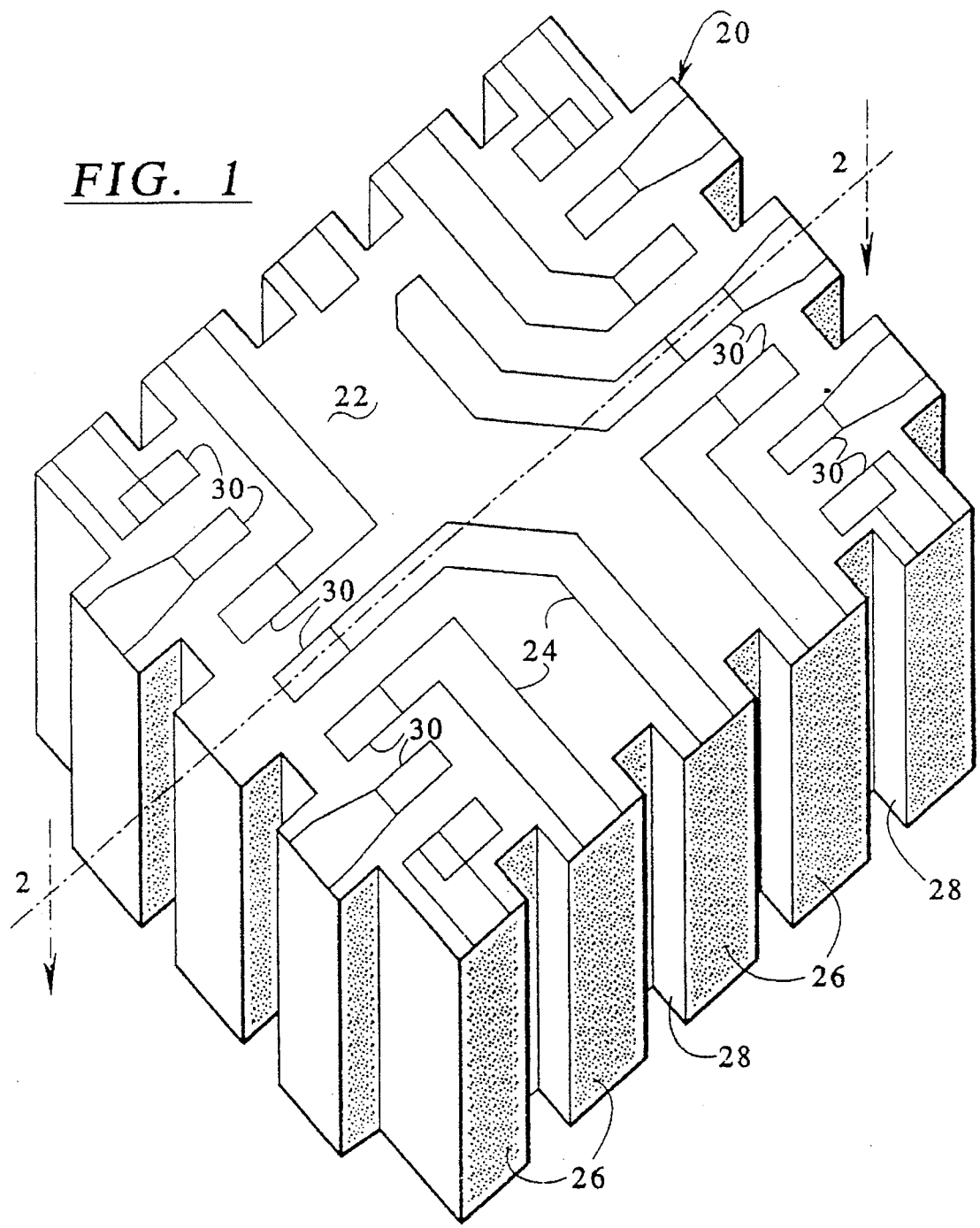
FIG. 1 is a perspective view of a monolithic ceramic multiple capacitor according to the present invention.

FIG. 1 is a perspective view of a monolithic multiple ceramic capacitor 20 according to the present invention. In FIG. 1, a surface 22 will be referred to for convenience as the top of the capacitor 20, although it should be evident that the capacitor 20 has no preferred orientation that represents the top or the bottom. The capacitor 20 can be used in any configuration, but the surface 22 is typically the last to be formed, and is often the top during fabrication. The surface 22 contains a number of conductors 24, printed on the surface 22 by a screening process or the like, that represent electrical connections to be made when the capacitor 20 is assembled into an electrical circuit. Each of these conductors 24 is connected to and edge 26 that has been metallized, typically by dipping it in a conducting ink, to connect to electrical conductors inside the capacitor 20 that are not shown here.

Adjacent edges 26 of FIG. 1 are separated by slots 28 that are typically saw cuts, made after the capacitor 20 has been fired. Saw cuts allow the width of the slots 28 to be kept independent of their depth, so that the capacitance between adjacent terminals is controlled by two independent variables, the width of the saw and the depth of the cut. The use of saw cuts to make the castellations resulting from the slots 28 allows the slots 28 to be placed closer to each other than they could be if they were produced by drilling, and it allows the depth of individual cuts to be varied from those of adjacent ones if desired. In addition to these functional advantages, the use of saw cuts provides production advantages that make it possible to produce capacitors better and faster than other methods of castellating the edge connections.

Portions of some of the conductors 24 are placed to serve as tabs 30 to which to connect the pins of an integrated-circuit (IC) Chip, surface-mounted component, or printed resistor, none of which is shown here. An IC is typically wire-bonded while a surface-mounted component will probably be soldered. Since the capacitor 20 may be used with a miniature electronic circuit such as a hearing aid that fits in a human ear, its length and width are typically of the order of 3 to 4 millimeters and its thickness is typically of the order of 1 or 2 millimeters. Other applications may call for different dimensions, either larger or smaller. A bottom surface of the capacitor 20 that is not shown here can also be used to support an IC or a surface-mounted component as described for the surface 22.

Figure 2:
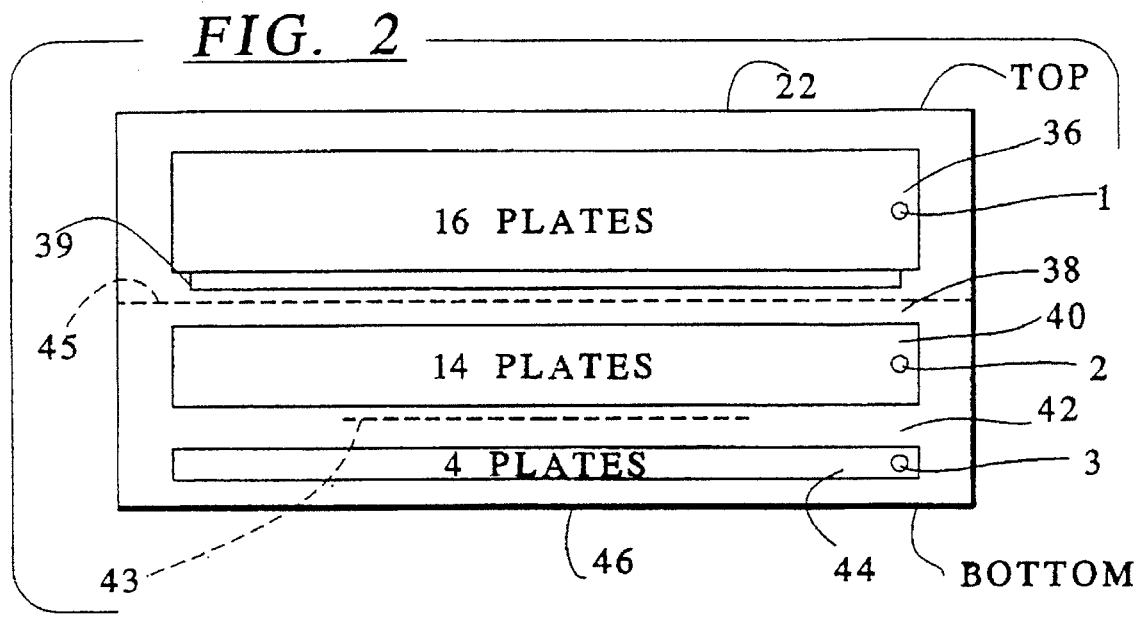
FIG. 2 is a schematic sectional side view of the capacitor taken along line 2—2 of FIG. 1.

FIG. 2, is a schematic sectional side view of the capacitor of FIG. 1 taken along section lines 2—2 of FIG. 1. In FIG. 2, the surface 22 is formed of several layers, typically three, of green tape. Green tape is a suspension of powdered ceramic material such as barium titanate, strontium titanate, or other ceramic material selected for its dielectric and loss properties, bonded together by a binder that is typically organic. The green tape is typically of the order of 0.8 to 1.2 mils (about 80 to 120 micrometers) in thickness before it is compressed and baked. Baking the green sinters the ceramic material and drives off the binder to leave a monolithic ceramic material. The green tape is made with a binder of a substance such as polyvinyl butyrol or an acrylic material.

Below the surface 22 in FIG. 2 is a region 36 that contains a number of conductors printed on green tapes which are then compressed, cut apart, and sintered or heat-fused. The conductors are disposed in patterns that will be shown later in detail. In the embodiment of the invention that was built and tested, the region 36 contained sixteen conductors interleaved and interconnected to comprise capacitor plates. A region 38 contains additional layers of dielectric material, some of which may be of a dielectric constant selected to reduce or control parasitic capacitance or coupling. The region 38 may also contain a ground plane 39 to reduce stray or parasitic capacitance between the region 36 and a region 40 that contains fourteen conducting surfaces interleaved and interconnected to comprise a second capacitor. A region 42 may consist entirely of ceramic material or it may, as shown, include a conducting layer to serve as another ground plane 43. A region 44 contains conducting surfaces separated by dielectric material to form a third capacitor. A bottom surface 46 of ceramic material completes the major structure of the capacitor 20.

A sheet 45 of ceramic material having a lower dielectric constant, of the order of 100, than that of the ceramic material used in the capacitors is shown in FIG. 2 as a dashed line. When a single sheet such as sheet 45 was used in making a capacitor, the stray capacitance between the nearest capacitor and ground was reduced to about 25% of its former value.

Figure 3:
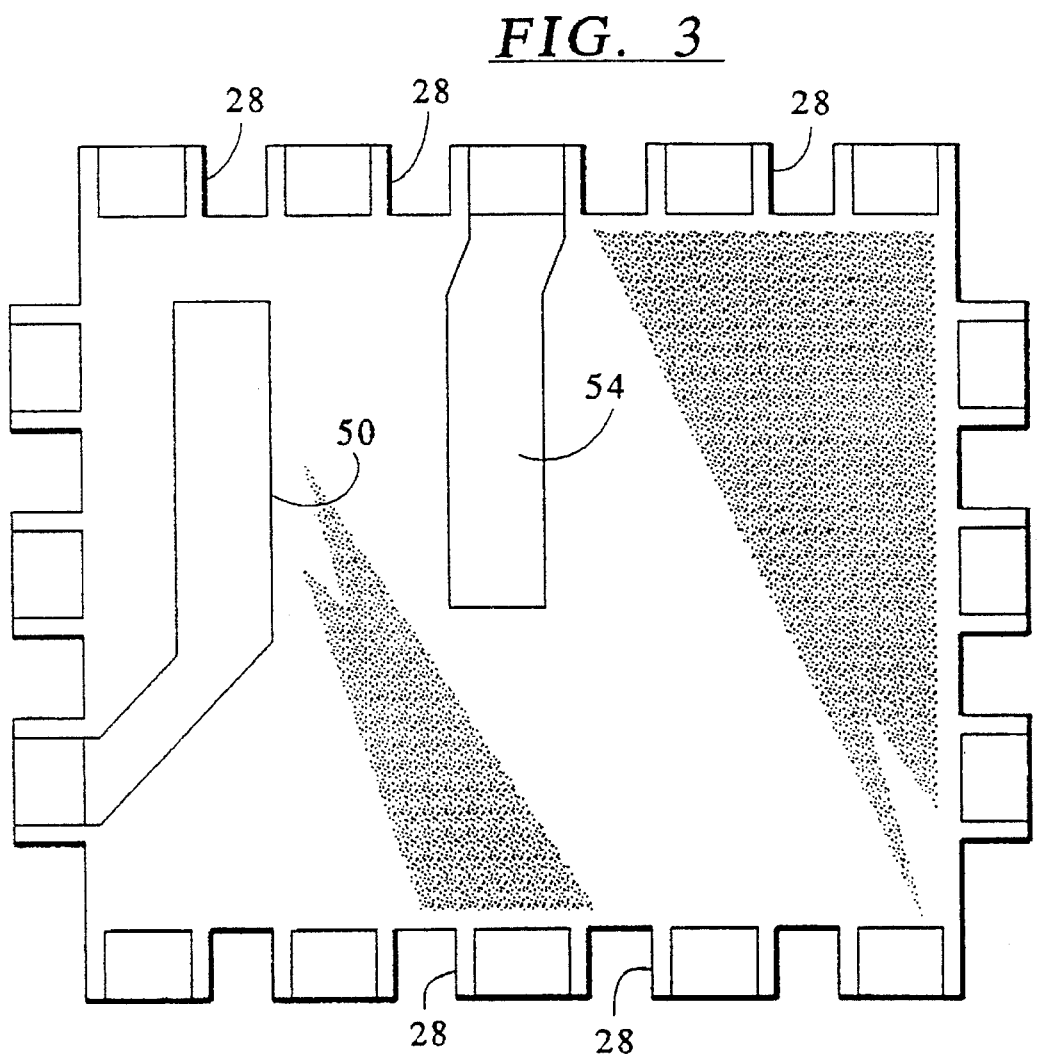
FIG. 3 is a plan view of the metallization of the bottom surface of the capacitor of FIG. 1.

FIG. 3 is a plan view of the metallization of the bottom surface of the capacitor 20 of FIG. 1. As mentioned earlier, the term "bottom" is relative and is used for convenience; the capacitor 20 can be used in any orientation. In FIG. 3, the slots 28 of FIG. 1 can be seen from the bottom. A conductor 50 is connected to a conducting edge 52 and thus through the edge 52 to one of the tabs 30 that are on the surface 22 of FIG. 1. Another conductor 54 is connected to a conducting edge that is not shown but that similarly makes a connection with one of the tabs 30. The conductors 50 and 54 are available to make external connections to a battery, microphone, or loudspeaker in the case of a hearing aid and to whatever external components may be needed in another miniature electronic application.

Figure 4:
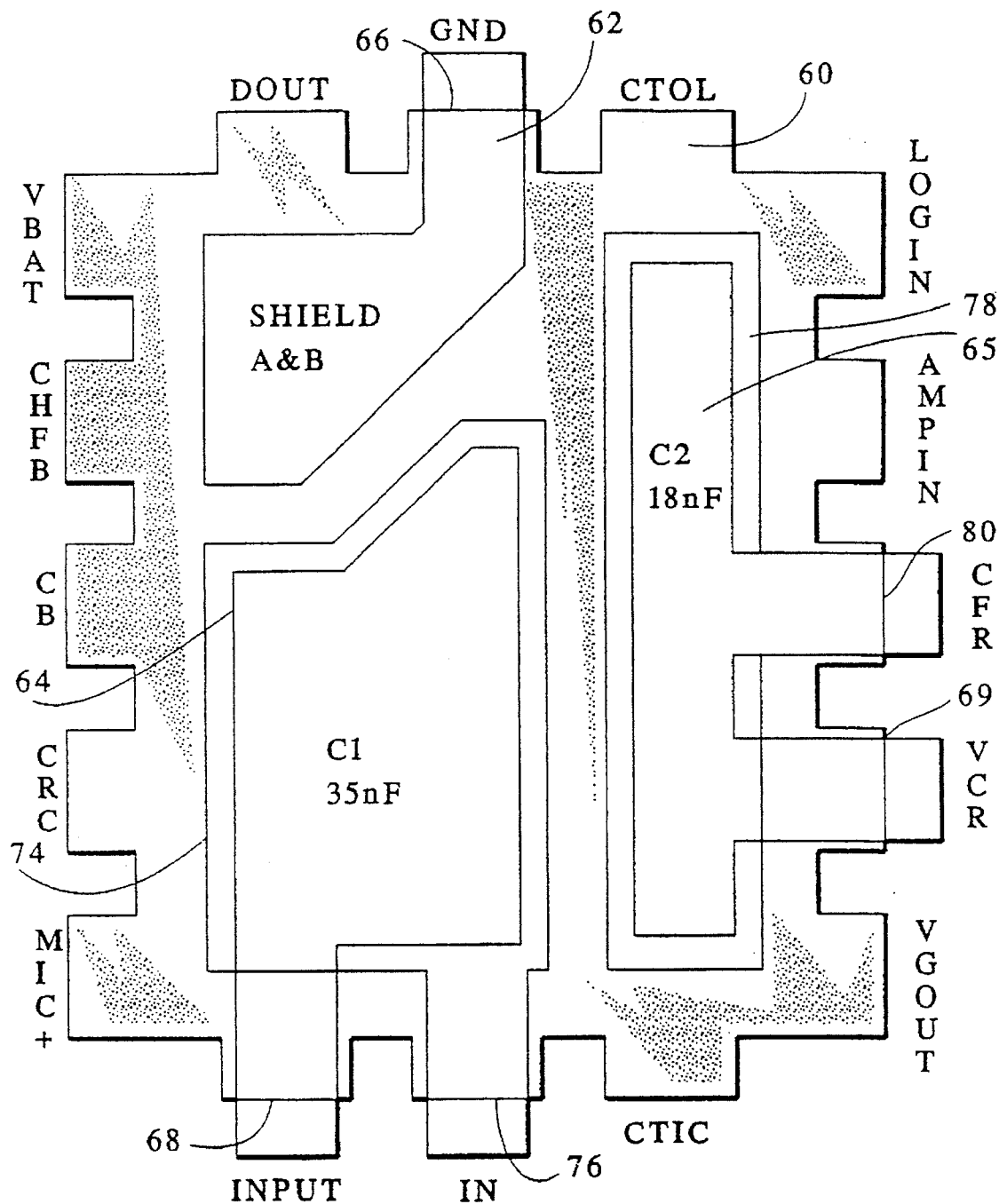
FIG. 4 is a plan view of the metallization of level 1 of the capacitor of FIG. 2.

FIG. 4 is a plan view of the metallization of level 1 of FIG. 2. In FIG. 4, a surface 60 is a ceramic which was formed by sintering a green tape upon which several conducting layers are shown for purposes of convenience and to illustrate the complete layout of each capacitor. The capacitors are constructed by depositing layers alternately as follows. First, a ground 62 and a plate 65 are deposited by screening or a similar method on the surface 60. The ground 62 is connected to an edge 66 which as been seen is connected to one of the tabs 30 of FIG. 1, and the plate 65 is similarly connected to an edge 69 and to another of the tabs 30. A layer of ceramic material is placed over the ground 62 and the plate 64 to form a new surface 60 upon which conducting ink is deposited to form the other plates of several capacitors. Another ground 62 is deposited as shown to form a shield in each layer and to connect to the edge 66. A plate 74 forms a capacitor with the plate 64, and makes an external connection to an edge 76. A plate 78 forms with the plate 65 another capacitor that makes an external connection at an edge 80. As indicated in FIG. 2, layers containing the ground 62 and the plates 64 and 65 are alternated with layers containing the ground 62 and the plates 74 and 78 for a total of sixteen plates to produce capacitors having the desired values of capacitance. Alternate rows of plates are connected together at the edges 66, 68, 69, 76 respectively. In the embodiment of the invention that has been built and tested, the capacitance between the edges 68 and 76 was 35 nanofarads and the capacitance between the edges 69 and 80 was 18 nanofarads. The structure shown here will exhibit parasitic capacitances between the edges 66 and 68, 66 and 69, 66 and 76, 66 and 80, 68 and 69, 68 and 80, 69 and 76, and 76 and 80, in addition to the capacitances between adjacent edges. At least some of these represent potentially usable values of capacitance. For some or all of these values of capacitance, changes in the ceramic material selected so as to change the dielectric constant of the material provides the possibility of changing the amount of the capacitance to a desired value for use as a circuit element.

Figure 5:
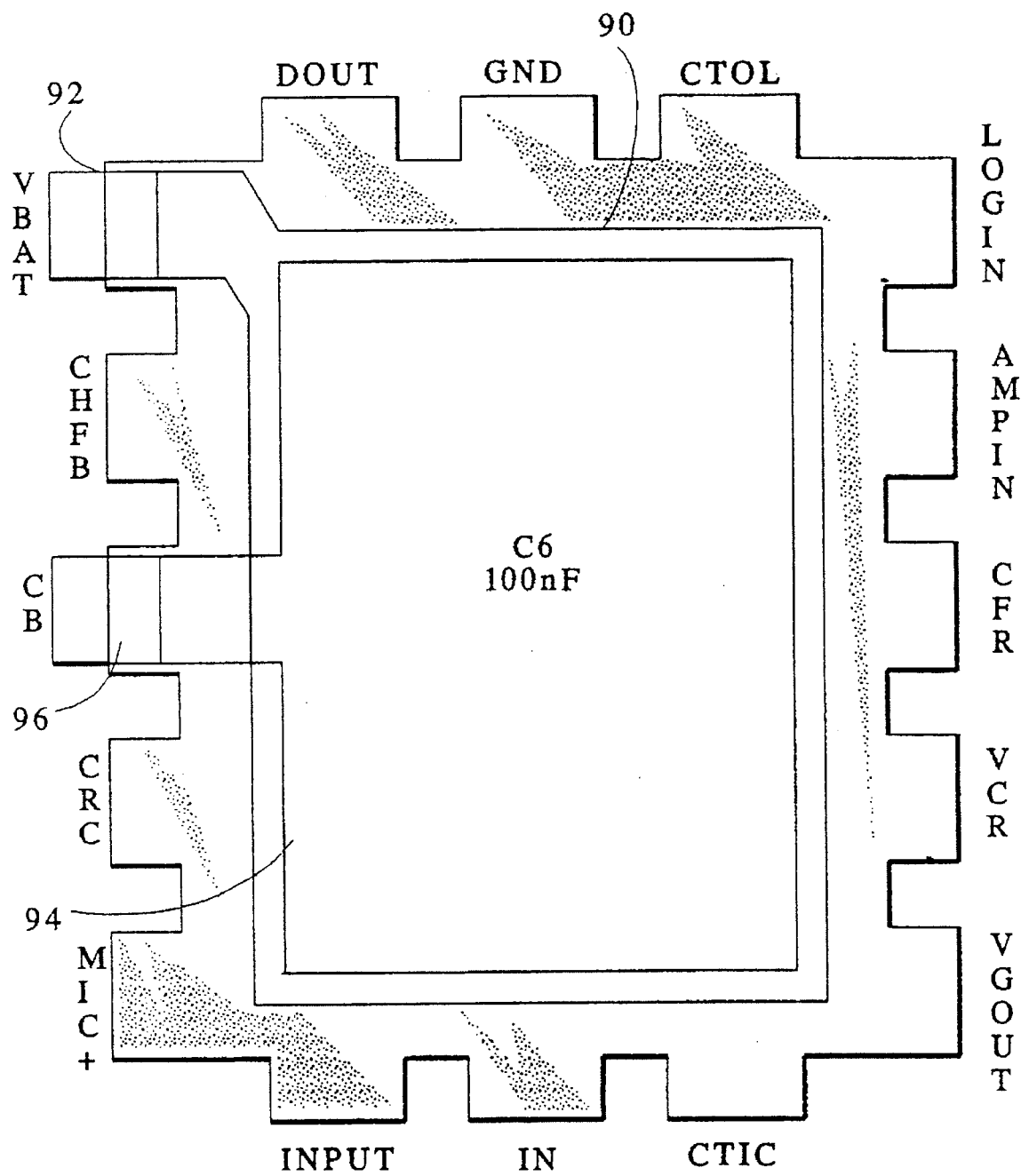
FIG. 5 is a plan view of the metallization of level 2 of the capacitor of FIG. 2.

FIG. 5 is a plan view of the metallization of level 2 of FIG. 2. In FIG. 5, a plate 90 is connected to an edge 92 on one layer and a plate 94 is connected to an edge 96 in the next succeeding layer. As noted in FIG. 2 fourteen such plates are stacked to create between the edges 92 and 96 a capacitor having a value of 100 nanofarads. As with the capacitors of FIG. 4, stray capacitance exists between the edges 92 and 96 and other such edges.

Figure 6:
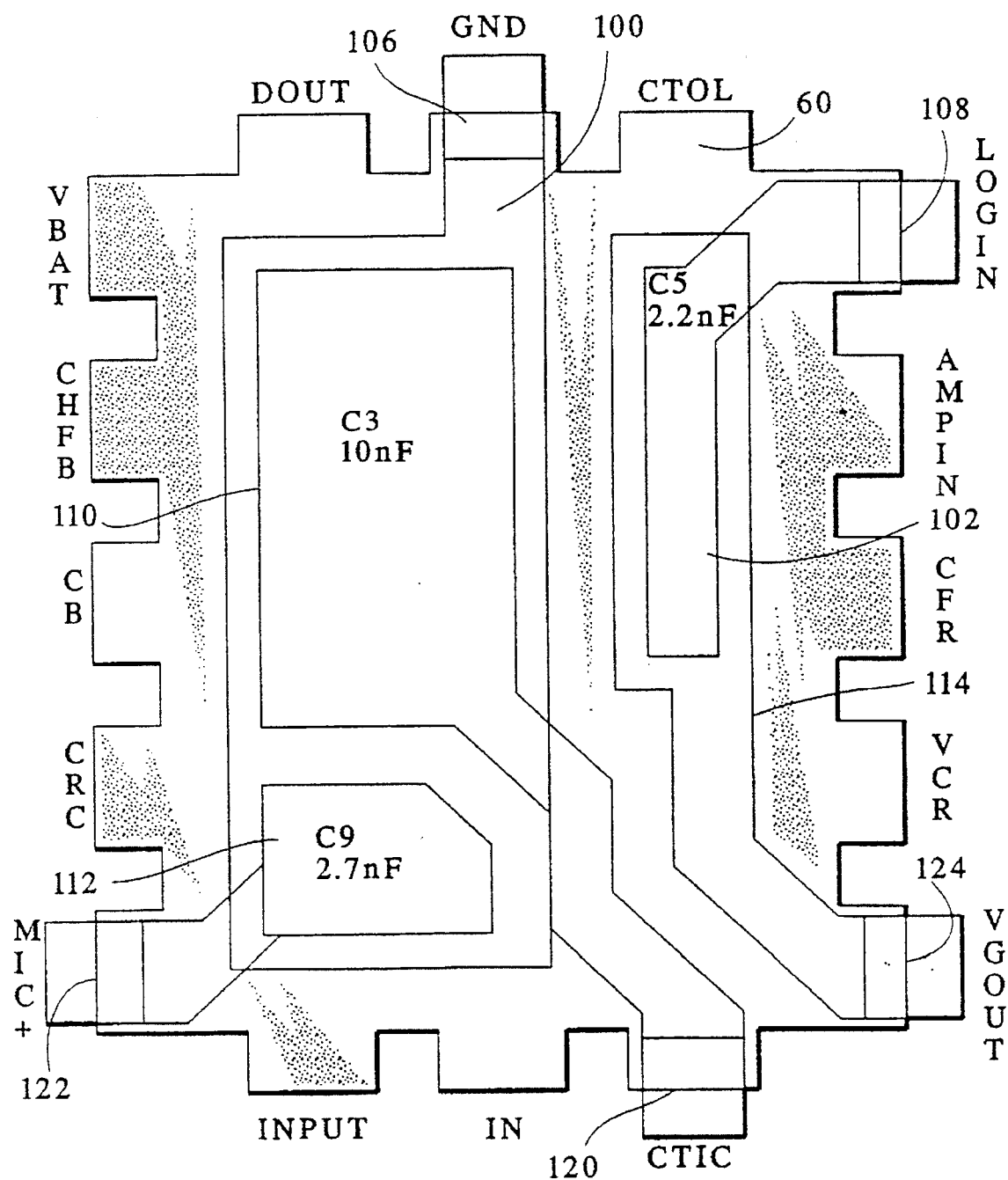
FIG. 6 is a plan view of the metallization of level 3 of the capacitor of FIG. 2.

FIG. 6 is a plan view of the metallization of level 3 of FIG. 2. In FIG. 6, is a plan view of the metallization of level 3 of FIG. 2. In FIG. 6, the surface 60 is another layer of ceramic material, first deposited as green tape and then heated to sinter the ceramic particles. Printed on the surface 60 when it is green tape are a ground 100 and a plate 102. The ground 100 and the plate 102 are covered by a layer of ceramic material upon which are deposited a conducting layer 110, a conducting layer 112, and a conducting layer 114. The conducting layer 110 is brought out to connect to an edge 120; the conducting layer 112 is connected to an edge 122;

and the conducting layer 114 is connected to an edge 124. The layers 110 and the grounds 100, together with the dielectric ceramic material separating them, form a capacitor between the edges 106 and the edge 120. The layers 112 and the grounds 100 form another capacitor having connections at the edges 106 and 122. The layers 102 and 114 form a capacitor between the edges 108 and 124. In the embodiment of the invention that has been built, four layers of plates were deposited to produce a capacitance between the edges 106 and 120 of 10 nanofarads. The capacitance between the edges 106 and 122 was 2.7 nanofarads and the capacitance between the edges 108 and 124 was 22 nanofarads. As before, parasitic capacitances exist between the edges associated with the ground and layers that are not paired above.

Figure 7:
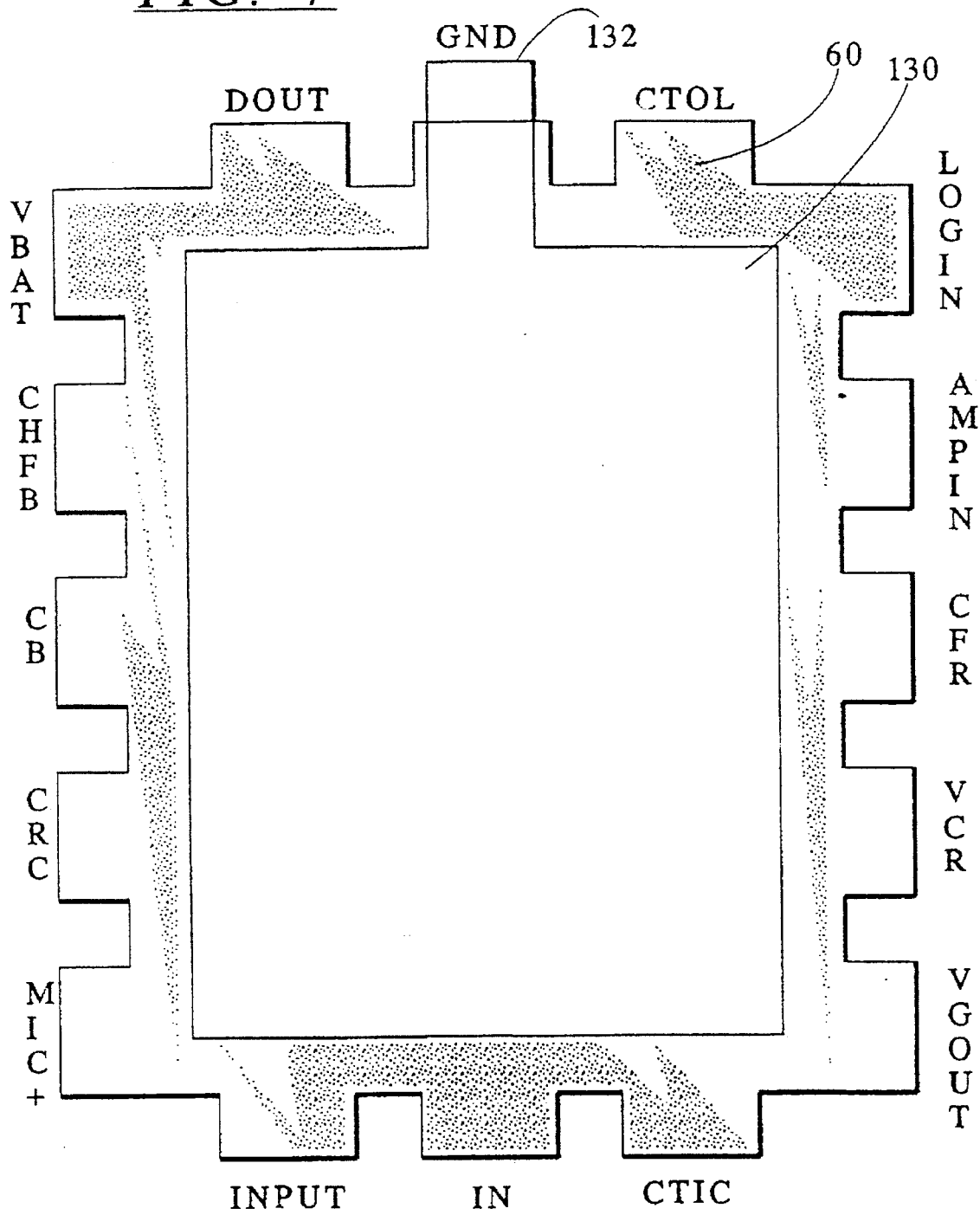
FIG. 7 is a plan view of the metallization of ground plane of the capacitor of FIG. 2.

FIG. 7 is a plan view of the metallization of the ground plane or ground planes of FIG. 2. In FIG. 7, the ceramic surface 60 is largely covered by a ground plane 130 that may be used to isolate the capacitors in any of the layers from those in other layers to reduce the parasitic capacitances between pairs of terminals associated with the conductors in different sets of layers. The ground plane 130 is connected to an edge 132 that is also common to the edge 106 of FIG. 6 and the edge 66 of FIG. 4.

Figure 8:
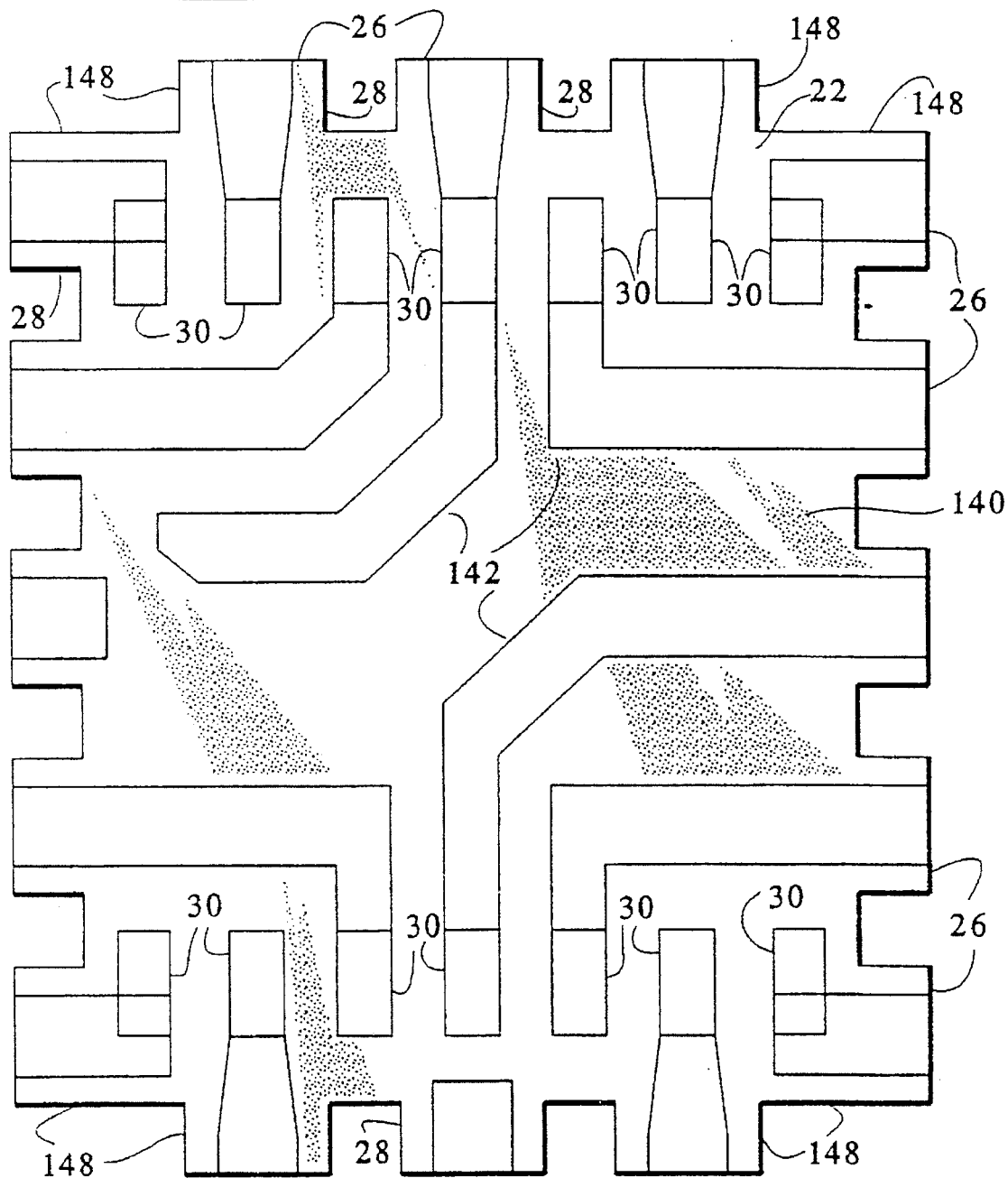
FIG. 8 is a plan view of the metallization of the top surface of the capacitor of FIG. 1.

FIG. 8 is a plan view of the metallization of the top surface of the capacitor of FIG. 1. In FIG. 8, the surface 22 includes an un-metallized ceramic region 140 upon which are printed a number of electrical conductors 142. Fourteen separate regions of the conductors 142 are aligned to include the tabs 30 which serve as connection points to mount a fourteen-pin IC chip that is not shown here. It would be equally possible to mount there other IC chips or components by wire bonding or flip-chip technology. Each of the tabs 30 is typically connected to one of the edges 26 which make electrical connections to regions inside the capacitor 20 as shown. The slots 28 both insulate adjacent edges 26 from one another and reduce the capacitance between adjacent edges 26 by inserting an air dielectric in a part of the path between adjacent edges 26. Corner cuts 148 separate edges 26 that are in the corners. The capacitor 20 that was built to practice the present invention was designed to fit the terminals of a fourteen-pin custom IC chip. It would have been possible to change the dimensions of the surface 22 of FIG. 8 to accommodate a different pin layout of an IC chip. It would also have been a simple matter to make bridging connections between elements on the surface 22 by printing a bridging conductor on a layer of green tape that is separated from the conductors on the surface 22 by a layer of green tape. In addition, the surface 22 shows only conducting paths. It would also have been a simple matter to print one or more thick-film resistors on the surface 22 to become a part of an electronic circuit that would be miniaturized.

Figure 9:
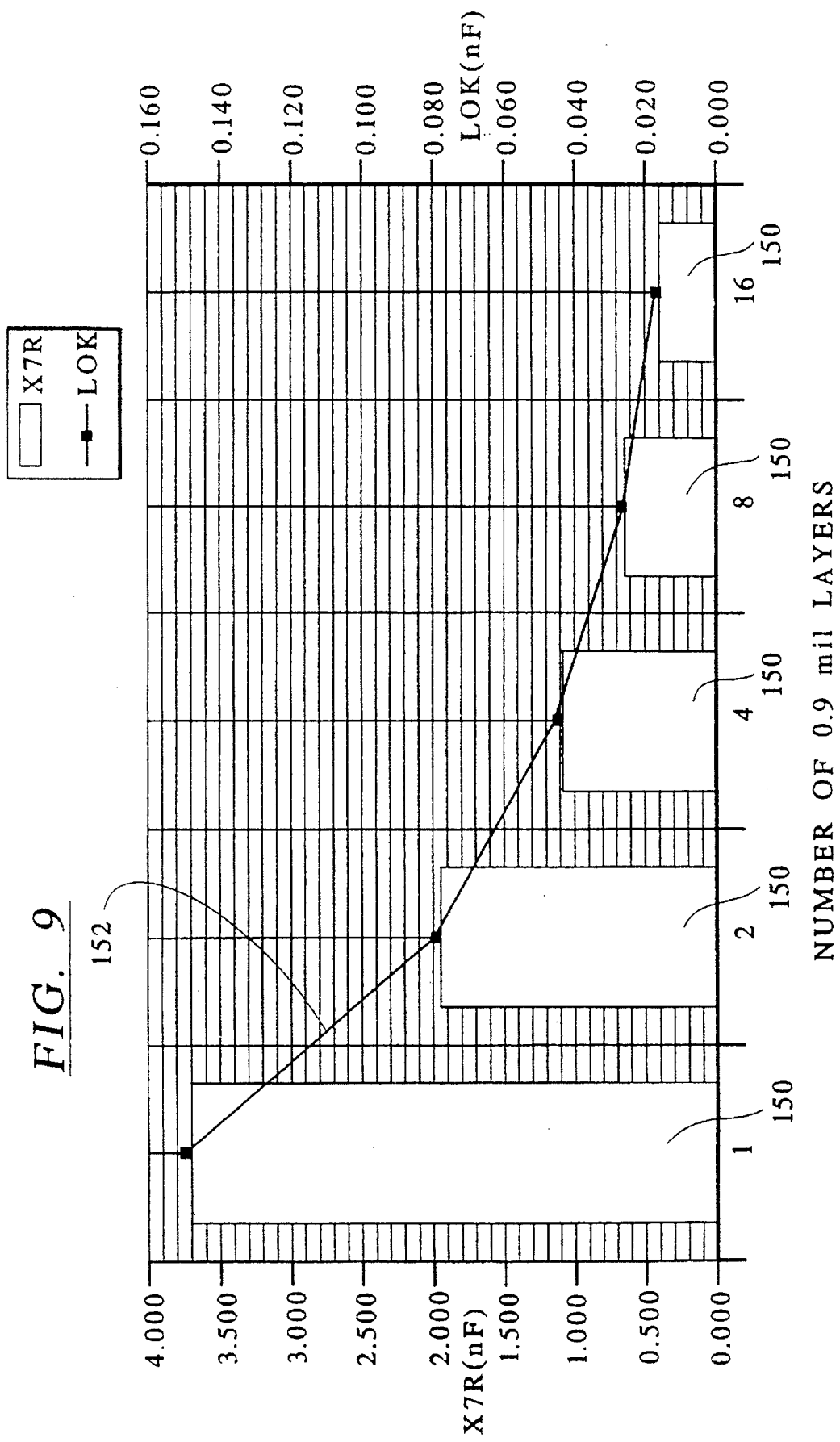
FIG. 9 is a plot of the capacitance between an outer capacitor plate and an infinite ground plane as a function of the number of layers of green tape for two different ceramic dielectrics.

FIG. 9 is a plot of capacitance between an outer capacitor plate and an infinite ground plane as a function of the number of layers of green tape for two different ceramic materials having different dielectric constants. In FIG. 9, a curve 150 represents capacitance between an outer conductor and a ground plane at infinity as a function of the number of layers of green tape made of a material having a dielectric constant of about 2600, sintered as described earlier, and a curve about 2600, sintered as described earlier, and a curve 152 represents capacitance between the outer conductor and a ground plane at infinity as a function of the number of layers of green tape made of a material having a dielectric constant of about 100, similarly sintered. It can be seen from FIG. 9 that the capacitance between the outer conductor and ground can be set at a desired value by selecting an appropriate number of layers of a particular ceramic material or of a combination of the ceramic materials shown.

The capacitor of the present invention was made of a number of commercially available components. The ceramic material used for most of the capacitor was a barium titanate compound that was either Tam Ceramics Type 262L or Tam Ceramics Type XL103. Tam Ceramics Type 262L has a dielectric constant of about 2600 and Tam Ceramics Type XL103 has a dielectric constant of about 9000. Other commercially available ceramic materials could be used as well. To help control parasitic capacitance, layers of green tape were made with Tam Ceramics Type CL90, which has a dielectric constant of about 90. Two layers of green tape of the lower dielectric constant were placed above the upper level, eight were placed above the middle level, two were placed above the lower level, and two were placed below the lower level. The structure disclosed here, including the use of the low-dielectric layers and the slots 28 of FIG. 8 provided the values of capacitance shown in the Table.

| Level in FIG. 2 | Capacitor number | Capacitor value |
| --- | --- | --- |
| 1 | 1 | 35 nf |
| 1 | 2 | 22 nf |
| 2 | 6 | 100 nf |
| 3 | 3 | 10 nf |
| 3 | 5 | 3.0 nf |
| 3 | 9 | 3.0 nf |

Figure 10:
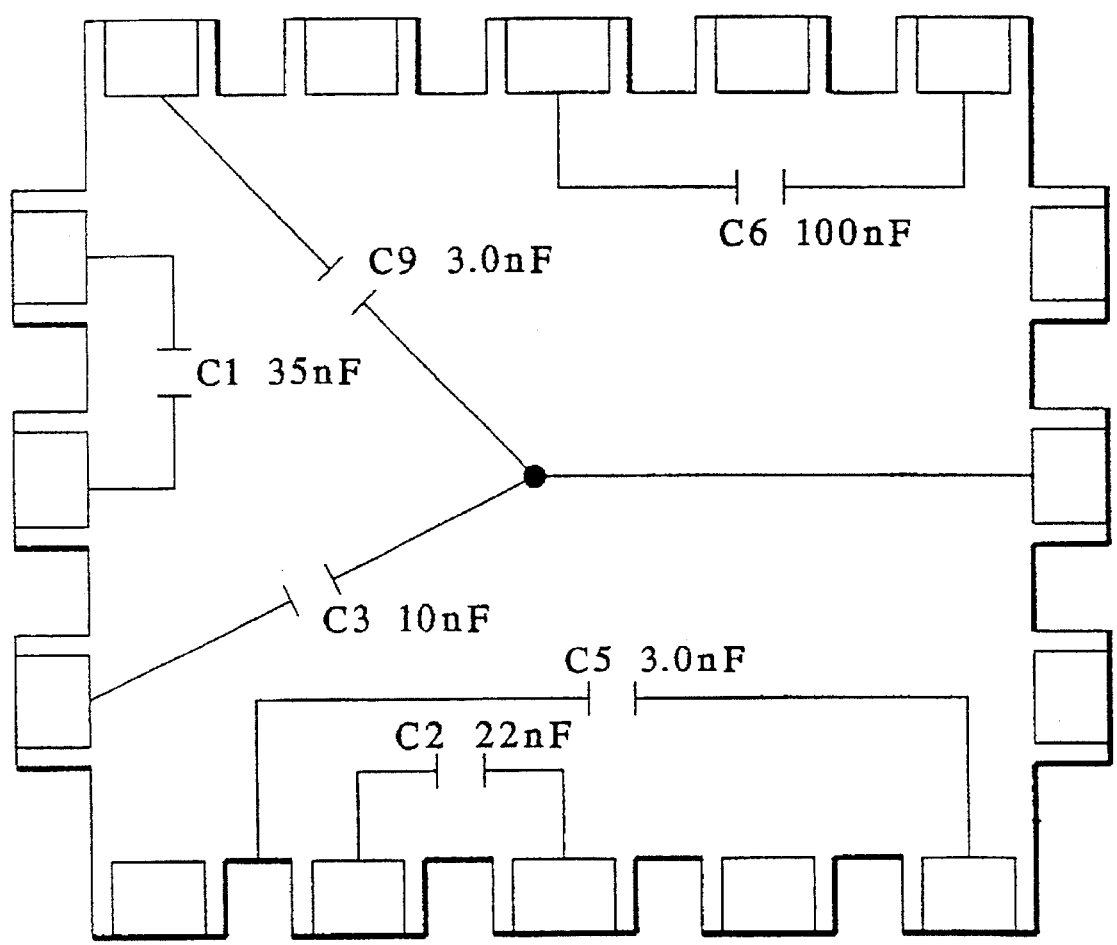
FIG. 10 is a view of the bottom of the capacitor as shown in FIG. 2 with the capacitors of the Table associated with the external terminals to which they are brought out.

FIG. 10 is a view of the bottom of the capacitor as shown in FIG. 2 with the capacitors of the Table associated with the external terminals to which they are brought out. Other values of capacitance representing stray or parasitic capacitances between other pairs of terminals can also be used as circuit elements and can be adjusted in value during manufacturing as described above.

Figure 11:
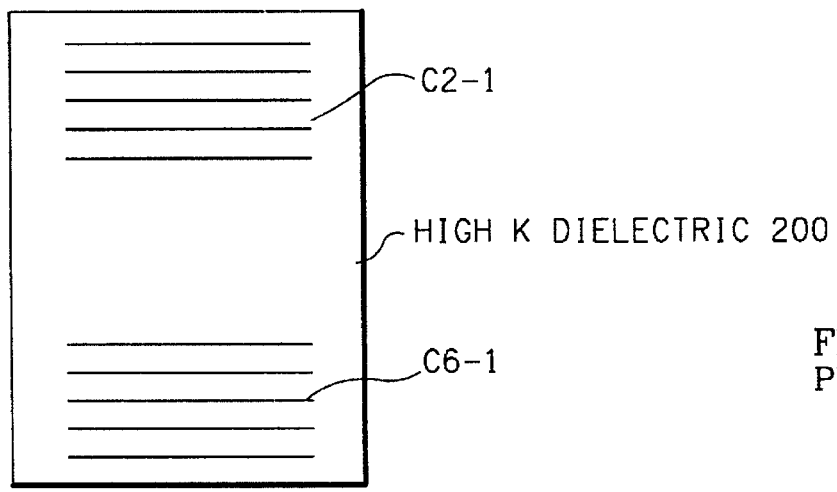
FIG. 11 is a simplified cross-section plan view of a prior art ceramic multiple capacitor where two buried-substrate capacitors are separated by ceramic of the same dielectric constant as separates metallization layers of each buried-substrate capacitor itself.

A simplified cross-section plan view of a prior art ceramic multiple capacitor where two buried-substrate capacitors are separated by ceramic of the same dielectric constant as separates metallization layers of each buried-substrate capacitor itself is shown in FIG. 11. The capacitors C2-1 and C6-1 may be, for example, arrayed similarly to capacitor C2 that is shown in FIG. 4 and to capacitor C6 that is shown in FIG. 5. The dielectric is uniformly a HIGH K DIELECTRIC 200-1.

Figure 12:
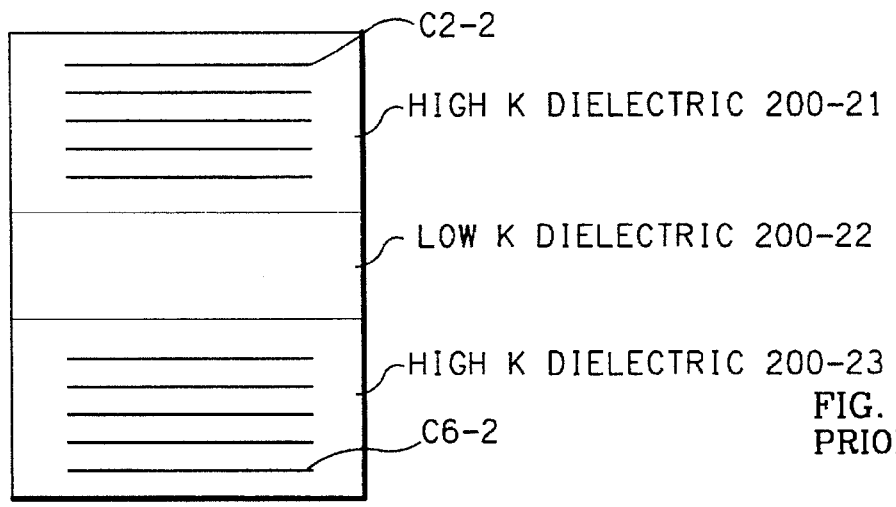
FIG. 12 is a simplified cross-section plan view of a prior art ceramic multiple capacitor where two buried-substrate capacitors are separated by ceramic of a lower dielectric constant than is the dielectric constant of the ceramic layers that separate metallization layers of each buried-substrate capacitor itself.

A simplified cross-section plan view of a prior art ceramic multiple capacitor where two buried-substrate capacitors are separated by ceramic of a lower dielectric constant than is the dielectric constant of the ceramic layers that separate metallization layers of each buried-substrate is shown in FIG. 12. The capacitors C2-2 and C6-2 may be, for example, arrayed similarly to capacitor C2 that is shown in FIG. 4 and to capacitor C6 that is shown in FIG. 5. The dielectric of capacitor C2-2 is HIGH K DIELECTRIC 200-21, and the dielectric of capacitor C2-2 is HIGH K DIELECTRIC 200-23. Dielectrics 220-21 and 200-23 are normally the same dielectric material. The dielectric between the capacitors C2-2 and C2-6 is a LOW K DIELECTRIC 210-22.

Figure 13:
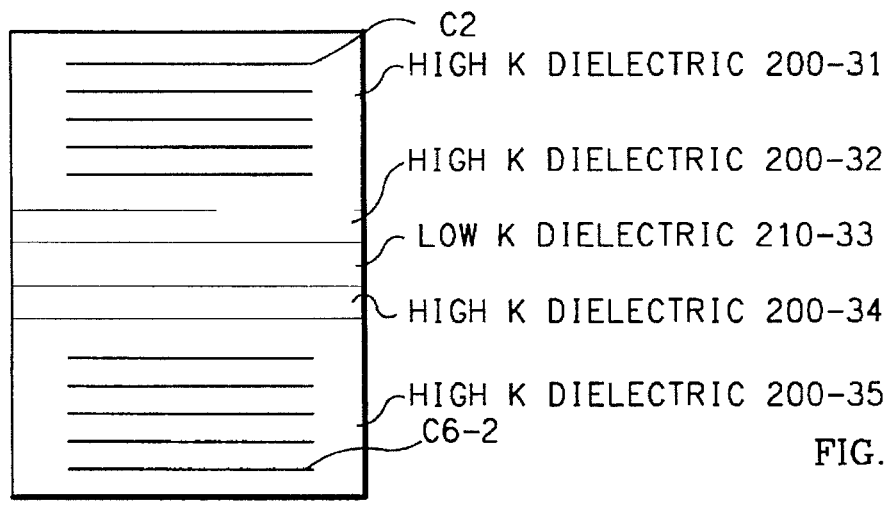
FIG. 13 is a simplified cross-section plan view of a ceramic multiple capacitor in accordance with the present invention where two buried-substrate capacitors are separated by a three-layer sandwich of ceramic respectively having the same, a lower, and the same dielectric constant as is the dielectric constant of the ceramic layers that separate metallization layers of each buried-substrate capacitor itself.

FIG. 13 is a simplified cross-section plan view of a ceramic multiple capacitor in accordance with the present invention. In this embodiment two buried-substrate capacitors C2 and C6—previously respectively seen in FIGS. 4 and 5—are separated by a three-layer sandwich of ceramic respectively having the same, a lower, and the same dielectric constant as is the dielectric constant of the ceramic layers that separate metallization layers of each buried-substrate capacitor itself. Namely, the capacitor C2 is made of HIGH-K DIELECTRIC 200-31, and capacitor C6 of HIGH-K DIELECTRIC 200-35. These are normally the same dielectric material.

A border layer—thicker than any of the dielectric layers within the capacitor C2 itself—of HIGH K DIELECTRIC 200-32 borders on a final, like, layer of HIGH K DIELECTRIC 200-31 within the capacitor C2 itself. Likewise, another border layer—thicker than any of the dielectric layers within the capacitor C6 itself—of HIGH K DIELECTRIC 200-34 borders on a final, like, layer of HIGH K DIELECTRIC 200-35 within the capacitor C6 itself. Likewise, another border layer—thicker than any of the dielectric layers within the capacitor C6 itself—of HIGH K DIELECTRIC 200-34 borders on a final, like, layer of HIGH K DIELECTRIC 200-35 within the capacitor C6 itself. The HIGH K DIELECTRIC 200-32 is normally the same material as HIGH K DIELECTRIC 200-34, and both are normally the same material as HIGH K DIELECTRICs 200-31 and 200-35.

A layer of LOW K DIELECTRIC 210-33 that is normally thicker yet again than either of border layers of HIGH K DIELECTRIC 200-32 and 200-34 is located between these layers, as in a sandwich.

The HIGH K DIELECTRIC layers 200-31, 200-32, 200-34 and 200-35 are preferably of barium titanate composition with an approximate K=2600. The LOW K DIELECTRIC layer 210-33 is preferably of barium titanate doped with neodinium, and preferably has an approximate K=100.

The thick layer of LOW K DIELECTRIC 210-33 reduces parasitic capacitance, and electrical signal crosstalk, between capacitors C2 and C6 more effectively and completely than would a low K dielectric material. In the preferred embodiment of the invention shown in FIG. 13 and negative effects of such an apparently unavoidable physiochemical reaction as (i) occurs at the boundaries between, on the one hand, HIGH K DIELECTRIC layers 200-32 and 200-34 and, on the other hand, LOW K DIELECTRIC layers 210-33 are removed from the HIGH K DIELECTRIC layers 200-31 and 200-35 of capacitors C2, C6. This physiochemical reaction "contaminates" both the HIGH K DIELECTRIC layers 200-32 and 200-34 and the LOW K DIELECTRIC layer 210-33, lowering the K of the first and raising the K of the second. This contamination would, should it strongly couple the capacitors C2 or C6, undesirably serve to lower the capacitance of these (buried substrate) capacitors C2 and C6, and increase leakage current.

However, in the preferred embodiment of FIG. 13, any such effects are mitigated, if not eliminated. The negative effects are so mitigated of eliminated because the physiochemical reaction zone, or band, between the HIGH-K DIELECTRIC layers 200-31 and 200-35 (from which each buried-substrate capacitor c2 and C6 is formed) and the LOW-K DIELECTRIC isolation layer 210-33 is moved slightly from the region of the capacitors C2, C6 themselves. So moved in position, this reaction zone no longer appreciably "contaminates" the high-K dielectric material, and no longer lowers its K. The capacitances of the buried-substrate capacitors C2 and C6 are no longer undesirably lowered, nor is its leakage current undesirably increased. The reaction zone, or band, is moved into the isolation region between capacitors themselves (where it has no appreciable deleterious effect save that the low-K of this region should slightly be raised).

The movement, or displacement, of the reaction zone, or band, is also believed to produce a ceramic multiple capacitor that is believed to be more strongly and stably fused together in its several layers than is, for example, at least the previous dual-dielectric-material capacitor constructed in the manner of FIG. 12. This belief is based on the fact that different layers of different dielectric constant, and the metallization layers of the buried capacitors, inevitably have slightly different thermal coefficients of expansion. In the prior art capacitor of FIG. 12 the final, generally thin, HIGH K DIELECTRIC insulating layers 200-21 and 200-23 were directly bordered by the thick LOW K DIELECTRIC buffer layer 210-33 that serves to isolate the two buried-substrate capacitors C2-2 and C6-2. That is, the high k dielectric insulating layers went from thin to thick at the same time as the dielectric constant of these layers went from high to low.

Progressing directly from thin to thick layers of different materials which have different thermal coefficients of expansion aggravates the potential for mechanical fracture induced by thermal stress. It is better to progress in a number or layers of progressively increasing thickness. Although fracture failure modes are not particularly common in a ceramic multiple capacitors, if such a capacitor is rapidly cycled over a very broad temperature range—such as might happen, inter alia, in a spacecraft—and/or if it is strongly shocked, then the resulting fracture failures can be related, as would be expected, to the "weakest" boundaries of the many, many layers within the ceramic multiple capacitor.

In the preferred embodiment of the present invention shown in FIG. 13, the HIGH K DIELECTRIC layers 200-32 and 200-34 are of intermediary thickness between the necessarily thin, outer, HIGH K DIELECTRIC layers 22-31 and 200-35 of a buried-substrate capacitors C2 and C6, and the necessarily thick isolation LOW K DIELECTRIC layer 210-33. These HIGH K DIELECTRIC layers 200-32 and 200-34 of intermediary thickness serve to, among other things, improve the mechanical stability of this region to thermal stress and/or to mechanical shock.

Finally, any diminishment in isolation arising from the fact that HIGH K DIELECTRIC layers 200-32 and 200-34 are not of a low K dielectric material is not invariably bad. The related patent application for CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS that only such capacitance as is neither electrically connected nor functionally used is called "parasitic"—a capacitance of a parasitic nature that is both electrically connected and functionally used is, by definition, no longer "parasitic". The "parasitic" capacitance may be electrically connected, and functionally used. It is therefore not adverse to the present invention that such "parasitic" capacitance as inevitably exists within a ceramic multiple capacitor, and particularly between the buried-substrate capacitors themselves, is not maximally suppressed.

In accordance with the preceding explanation, variations and adaptations of the monolithic, buried-substrate, multiple capacitors with integral conduction traces on selected surfaces in accordance with the present invention will suggest themselves to a practitioner of the electrical component design arts. For example, a multi-tier tower of many (integrated) circuits and multiple capacitors is possible. For example, multiple components could be solder bonded to each, or both, surfaces, and even a side or two, of a single multiple capacitor—making the multiple capacitor assume the role of a three-dimensional printed circuit board.

In accordance with these and other possible variations and adaptations of the present invention, the scope of the invention should be determined in accordance with the following claims, only, and not solely in accordance with that embodiment within which the invention has been taught.

What is claimed is:

1. A monolithic, buried-substrate, ceramic multiple capacitor having and containing multiple buried-substrate capacitors that themselves have and contain multiple layers of both high dielectric constant material and metallization, the ceramic multiple capacitor comprising:

a dual-dielectric-constant, three-layer-laminate, isolation layer between at least one of the multiple buried-substrate capacitors and at least one other of the multiple buried-substrate capacitors, the isolation layer serving to electrically isolate the least one of the multiple buried-substrate capacitors from the at least one other of the multiple buried-substrate capacitors, the isolation layer including an innermost layer of a low dielectric constant material, located between outer laminate layers of a high dielectric constant material, each outer laminate layer of high dielectric constant material bordering on a layer of high dielectric constant material within one of the buried-substrate capacitors that are electrically isolated.

2. The monolithic ceramic multiple capacitor according to claim 1 wherein each outer laminate layer of a high dielectric constant material is thicker than the layer of high dielectric constant material within one of the buried-substrate capacitors that it borders.

3. The monolithic ceramic multiple capacitor according to claim 2 wherein each outer laminate layer of a high dielectric constant material is at least twice as thick as the layer of high dielectric constant material within a one of the buried-substrate capacitors that it borders.

4. The monolithic ceramic multiple capacitor according to claim 1 wherein the high dielectric constant material of each outer laminate layer is the same material as the layer of high dielectric constant material within a one of the buried-substrate capacitors that it borders.

5. A monolithic, buried-substrate, ceramic multiple capacitor having and containing multiple buried-substrate capacitors that themselves have and contain multiple layers of both high dielectric constant material and metallization, the ceramic multiple capacitor comprising:

a dual-dielectric-constant, three-layer-laminate, isolation layer between at least one of the multiple buried-substrate capacitors and at least one other of the multiple buried-substrate capacitors, the isolation layer serving to electrically isolate the least one of the multiple buried-substrate capacitors from the at least one other of the multiple buried-substrate capacitors, the isolation layer including an innermost layer of a low dielectric constant material, located between outer laminate layers of a high dielectric constant material, each outer laminate layer of high dielectric constant material bordering on a layer of high dielectric constant material within one of the buried-substrate capacitors that are electrically isolated;

wherein each inner laminate layer of a low dielectric constant material is thicker than any of high dielectric constant material between plates of any of the buried-substrate capacitors that the isolation layer serves to electrically isolate.

6. The monolithic ceramic multiple capacitor according to claim 5 wherein each inner laminate layer of a low dielectric constant material is at least twice as thick as any of high dielectric constant material between plates of any of the buried-substrate capacitors that the isolation layer serves to electrically isolate.

7. A method of laying up a monolithic, buried-substrate, ceramic multiple capacitor in layers, the method comprising:

laying up, as multiple layers of both high dielectric constant material and metallization, a buried-substrate capacitor having multiple layers of both high dielectric constant material and metallization;

laying up onto the buried-substrate capacitor a dual-dielectric-constant, three-layer-laminate, isolation layer, the isolation layer including a first laid-up outer laminate layer of a high dielectric constant material, a second laid-up layer of a low dielectric constant material, and a third laid-up layer of a high dielectric constant material; and laying up on the isolation layer, as multiple layers of both high dielectric constant material and metallization, another buried-substrate capacitor having multiple layers of both high dielectric constant material and metallization.

8. A monolithic, buried-substrate, ceramic multiple capacitor laid-up in layers by laying up, as multiple layers of both high dielectric constant material and metallization, a buried-substrate capacitor having multiple layers of both high dielectric constant material and metallization, laying up onto the buried-substrate capacitor a dual-dielectric-constant, three-layer-laminate, isolation layer, the isolation layer including a first laid-up outer laminate layer of a high dielectric constant material, a second laid-up layer of a low dielectric constant material, and a third laid-up layer of a high dielectric constant material, and laying up on the isolation layer, as multiple layers of both high dielectric constant material and metallization, another buried-substrate capacitor having multiple layers of both high dielectric constant material and metallization, the monolithic, buried-substrate, ceramic multiple capacitor so laid-up being CHARACTERIZED IN THAT a dual-dielectric-constant, three-layer-laminate, isolation layer serves to isolate at least two adjacent buried-substrate capacitors.

* * * * *